United States Patent

Bailey

[15] 3,668,543

[45] June 6, 1972

[54] TRANSDUCER AMPLIFIER SYSTEM

[72] Inventor: Dean C. Bailey, Los Altos, Calif.

[73] Assignee: Intech Incorporated, Santa Clara, Calif.

[22] Filed: Jan. 31, 1968

[21] Appl. No.: 702,025

[52] U.S. Cl. ....................................330/30 D, 330/26, 330/14

[51] Int. Cl. ....................................H03f 3/68

[58] Field of Search ....................................330/30 D, 69, 85, 9

[56] References Cited

UNITED STATES PATENTS

| | | | |
|---|---|---|---|
| 2,475,258 | 7/1949 | Scott | 330/85 |
| 2,886,659 | 5/1959 | Schroeder | 330/69 X |
| 2,903,522 | 9/1959 | Flower | 330/85 X |
| 3,419,809 | 12/1968 | Lach et al. | 330/30 X |
| 3,427,560 | 2/1969 | Pincus | 330/85 X |

*Primary Examiner*—Nathan Kaufman

*Attorney*—Roger S. Borovoy, Alan Macpherson and Charles L. Botsford

[57] ABSTRACT

A solid state transducer amplifier system is provided in the form of a main operational amplifier having a differential input stage and an active series connected feedback loop as opposed to the conventional passive types of feedback. The active feedback loop incorporates a differential amplifier having an extremely accurate and linear differential transconductance characteristic such that the output voltage signal from the main operational amplifier fed to the differential feedback amplifier results in the generation of a differential feedback current proportional to this voltage. This differential feedback current generates a feedback voltage which is balanced against the differential input signal in the input stage so that changes in the differential input signal are followed by changes in the feedback voltage. Since the value of the differential feedback current is at all times determined by the output voltage signal from the main amplifier fed into the feedback loop, the output voltage signal constitutes a very accurate and linear amplification of the differential input signal.

The differential feedback current is virtually unchanged by the common mode differential input voltage applied to the input stage thereby assuring a high common mode rejection.

The active feedback amplifier itself incorporates current feedback to linearize and establish a more accurate transconductance characteristic. Towards this end, pairs of monolithic dual transistors are preferably utilized to provide excellent inherent matching and tracking necessary between the generated output currents and feedback currents.

11 Claims, 2 Drawing Figures

Figures 1, 2:
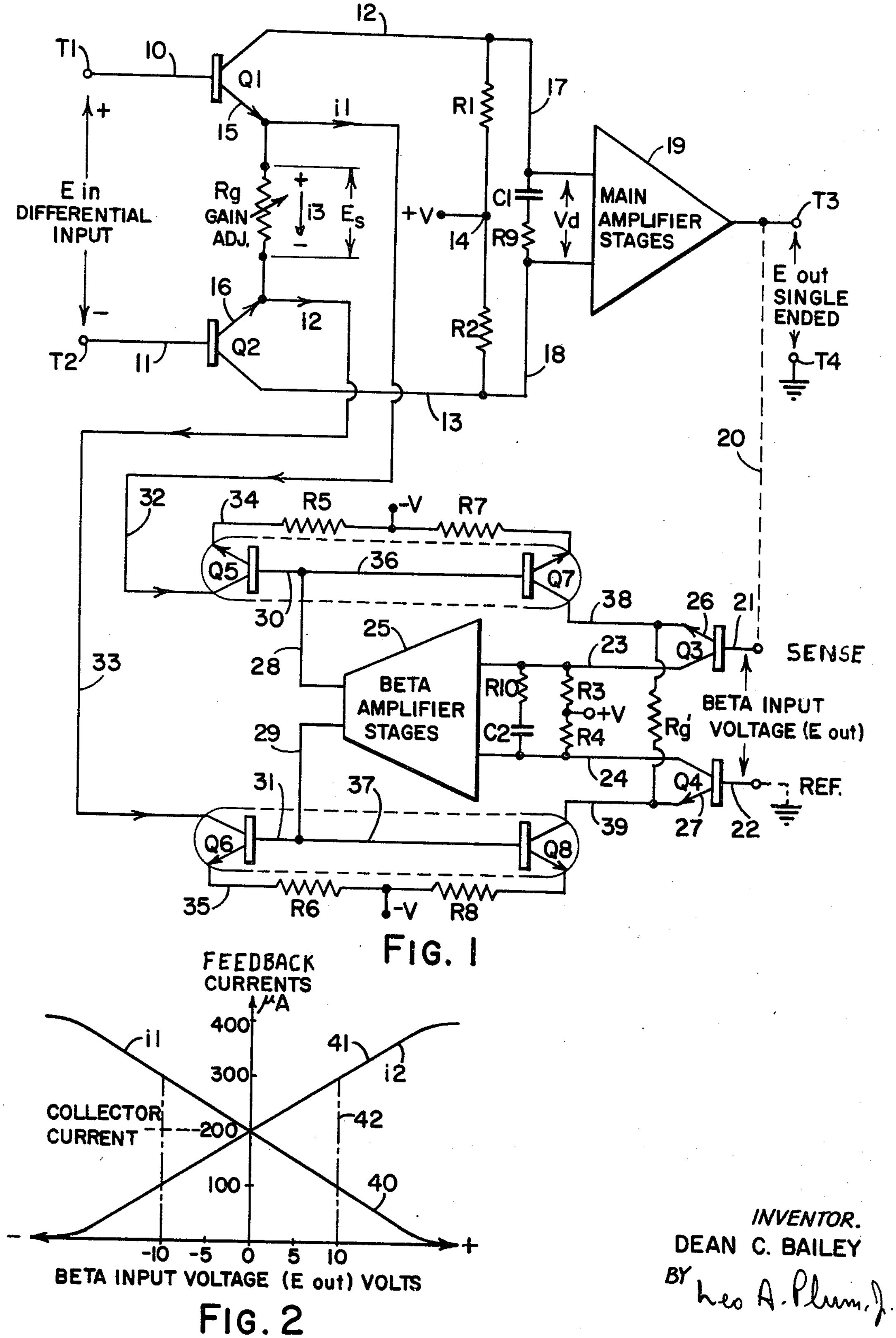

INVENTOR.
DEAN C. BAILEY
BY Leo A. Plum, Jr.

TRANSDUCER AMPLIFIER SYSTEM

This invention relates generally to transducer amplifier systems and more particularly to an improved solid state sensor type amplifier for very accurately and linearly amplifying low level remote signals.

In the amplification of relatively low level signals such as might be provided by sensor transducers, an amplifier having a "differential" input characteristic is normally used. By this arrangement, noise signals and other spurious signals common to both inputs to the differential amplifier stage are rejected, only the differential signal being utilized. In other words, such noise or other pickup will cause both input modes to vary in the same manner and thus will not affect the differential signal. This rejection of noise voltages relative to the signal voltage is referred to as the common mode rejection ratio of the amplifier and constitutes an important characteristic of such amplifier.

A specific example of the use of amplifiers of the foregoing type might be in the sensing and recording of biological measurements such as EKG's, muscular neuron activity, finger pulse, and so forth. In these cases, the sensor impedance can be relatively high primarily because of high skin resistance when the transducer probe is employed in direct contact with the skin surface. It is desirable, accordingly, that any transducer amplifier system be capable of a high degree of common mode rejection and also provide a relatively high input impedance.

Known operational type amplifiers do not perform satisfactorily when used alone in most applications of a transducer amplifier primarily because the two normal operating connections destroy the common mode rejection characteristics; that is, the balance of the input impedances to ground. The problem is particularly troublesome if the sensor impedance is very high. Even utilizing optimum conditions of balanced sources with operational amplifiers the common mode rejection ratio is unacceptable in many cases. In addition, costly resistors and manufacturing techniques to realize proper matching are necessary to the end that such applications are limited in performance because of economic considerations.

With the foregoing in mind, it is a primary object of the present invention to provide an extremely high quality low cost transducer amplifier system for amplifying low level remote signals from either low or high impedance transducer sources accurately and linearly.

More particularly, it is an object to provide a transducer amplifier system incorporating a high quality operational amplifier with accurate gain from a fully differential input to a single ended output with high common mode rejection.

Still another important object of this invention is to provide a transducer amplifier system in which the circuits are so designed as to render them suited for manufacture in the form of integrated circuits.

Briefly, these and many other objects and advantages of this invention are attained by providing a main operational amplifier with an input stage in the form of a difference amplifier for receiving a differential input signal and an active feedback differential amplifier, as opposed to conventional passive type feedback, connected in series between the output of the main operational amplifier and the input stage. This active feedback differential amplifier has a fixed transfer characteristic providing a differential generated current feedback proportional to the output voltage signal from the main operational amplifier. This differential current feedback is impressed on the difference amplifier of the input stage and will automatically adjust to a value to generate a negative feedback voltage substantially equal to the differential input signal. There is thus provided a transducer amplifier system with series feedback to provide a relatively high input impedance and maintain a high common mode rejection ratio.

The differential feedback amplifier or beta amplifier constitutes an important part of the present invention. The transconductance characteristic of the beta amplifier must be extremely accurate, linear, and well controlled since the accuracy of the transducer amplifier system is controlled by this factor. Proper linearization and accuracy in the transconductance characteristic to provide substantially ideal differential current generator outputs in the beta amplifier is realized by using dual monolithic transistors in a current feedback system for the beta amplifier itself. The excellent matching and tracking characteristics of these transistors enables the feedback currents utilized in the beta amplifier to be substantially identical to the generated output currents fed back to the input stage of the main operational amplifier. Further, this design utilizes the characteristics of transistor and resistor matching and tracking inherent in integrated circuits.

A better understanding of the invention will be had by now referring to one embodiment thereof as illustrated in the accompanying drawings, in which:

FIG. 1 is a schematic circuit diagram partly in block form showing a transducer amplifier system in accord with the present invention; and, FIG. 2 illustrates the transconductance characteristic of the active feedback amplifier portion of the circuit of FIG. 1 useful in explaining the operation of the circuit.

Referring first to FIG. 1 there is shown in the upper portion of the drawing a differential input stage in the form of a difference amplifier connected to a main operational amplifier means shown in block form, and in the lower portion of the drawing an input circuit connected to a beta amplifier forming the feedback means for the main transducer amplifier.

As shown, the input stage includes first and second transistors Q1 and Q2 having input terminals 10 and 11 for receiving a differential input signal Ein as might be applied between the points T1 and T2. The output terminals for the transistors Q1 and Q2 are shown at 12 and 13 and include equal valued load resistors R1 and R2 connected to a common junction 14 constituting the positive side of a suitable power supply +V. The common terminals for the transistors are illustrated at 15 and 16 and connect across a single gain setting resistor Rg.

The output terminals 12 and 13 connect through leads 17 and 18 to a main operational amplifier which may be multi-staged and is designated by the block 19. In the particular example chosen for illustrative purposes, the amplifier 19 has a single ended output indicated at T3 and T4. The output voltage signal is indicated at Eout.

As indicated by the dashed line 20, the output voltage signal passes to a sense terminal to provide with respect to a reference terminal, feedback voltage to a differential input circuit of the feedback amplifier. With this arrangement, potentials different from ground applied to the reference terminal will not affect the differential feedback signal to the input circuit and common mode rejection of signals common to both inputs is realized. The differential input circuit itself includes third and fourth transistors Q3 and Q4 having input terminals 21 and 22 receiving the output voltage signal from the main amplifier, and output terminals 23 and 24 connecting to a multi-staged differential amplifier designated by the block 25. These output leads include equal valued load resistors R3 and R4 supplied at their common junction with +V power as indicated. The common terminals 26 and 27 for the transistors Q3 and Q4 connect across a fixed resistor Rg'.

The differential output from the multi-stage beta amplifier 25 connects through leads 28 and 29 respectively to the base terminals 30 and 31 of transistors Q5 and Q6. These transistors constitute first transistors of first and second transistor pairs. As shown, the collector terminal leads for the first transistors are indicated at 32 and 33 and connect to the common terminals 15 and 16 in the input stage for the main operational amplifier. First and second currents in these collector leads are designated i1 and i2 and are impressed across the single gain setting resistor Rg.

The emitter terminals for the transistors Q5 and Q6 connect as indicated at 34 and 35 through suitable emitter resistors R5 and R6 to the negative voltage supply terminal of the power supply −V.

Second transistors in each of the first and second pairs are shown at Q7 and Q8. The base terminals of these transistors connect through leads 36 and 37 to the output leads 28 and 29 from the multi-stage beta amplifier 25. The collector terminals 38 and 39 connect respectively to the common terminals 26 and 27 of the transistors Q3 and Q4 and across the fixed resistor Rg'. The emitter terminals for the second transistors Q7 and Q8 connect through emitter resistors R7 and R8 to the negative voltage supply −V.

It is to be understood that the transistors Q1 and Q2 in the input stage for the main amplifier may constitute a bipolar transistor pair such as actually illustrated wherein the base terminals correspond to the input terminals 10 and 11, the collector terminals correspond to the output terminals 12 and 13, and the emitter terminals correspond to the common terminals 15 and 16. Alternatively, these first and second transistors could constitute field effect transistors, particularly when a very high input impedance is desired. In this event, the gate terminals for the field effect transistors would correspond to the input terminals 10 and 11, the drain terminals would correspond to the output terminals 12 and 13, and the source terminals would correspond to the common terminals 15 and 16.

The block 19 representing the main amplifier stages may constitute any commonly used solid state differential operational amplifier such as shown, for example, in U.S. Pat. No. 3,077,566. The beta amplifier stages within the block 25 may simply constitute a fully differential multi-stage amplifier.

The transistor pairs Q5, Q7, and Q6, Q8 constitute matched transistor pairs preferably monolithic types so that excellent matching and tracking of the transistors Q5 and Q7 and of the transistors Q6 and Q8 are inherent. The emitter resistors R5, R7 and R6, R8 are also precisely matched in value. The same is true for the load resistors R1 and R2 in the collector leads 12 and 13 in the input stage. The resistance-capacitor circuits R9, C1 and R10, C2 across the differential inputs of the main amplifier 19 and beta amplifier 25 assure phase-gain compensation and thereby provide loop stability for the system over its operating frequency range.

FIG. 2 shows at 40 and 41 the transconductance characteristic of the feedback amplifier portion of the circuit of FIG. 1. It will be evident that the variation of the generated currents i1 and i2 with changes in the beta amplifier input voltage are extremely linear over the typical operating range from −10 to +10 volts.

With the foregoing description of the various components and characteristics of the circuit in mind, the entire operation of the transducer amplifier system will now be described.

Considering first quiescent conditions, the differential input voltage Ein applied to the input circuit will be zero; that is, the voltages appearing on the base terminals 10 and 11 of the transistors Q1 and Q2 will be substantially identical with respect to ground. Also, the beta amplifier input voltage to the feedback amplifier means which is the same as the voltage output signal from the main amplifier will be zero resulting in exactly equal generated first and second currents i1 and i2. This balanced situation is clearly shown at FIG. 2 for zero input beta voltage wherein the curve values for i1 and i2 are indicated as approximately 200 microamperes. These generated currents serve as source currents for the emitter terminals 15 and 16 of the transistors Q1 and Q2. Since the load resistors R1 and R2 are precisely matched or equal, current from the +V power supply terminal will pass through the collector leads 12 and 13 and emitters 15 and 16, to the collectors 32 and 33 of the transistors Q5 and Q6. The collector currents in the collector leads 12 and 13 will thus be precisely balanced and the voltage drops developed across R1 and R2 will be exactly equal. As a result, the differential input signal designated Vd to the main amplifier stages 19 will be zero.

With zero difference voltage Vd applied to the main amplifier stages 19, there will be a zero output voltage signal and thus a zero beta input voltage signal to the feedback amplifier thereby satisfying the static loop conditions.

Considering now the generation of a differential input signal to the base terminals 10 and 11 of the transistors Q1 and Q2 such as might be received from a sensing transducer, the base voltages on the transistors Q1 and Q2 will become unbalanced. Assume that the polarity of the signal is such that the base of transistor Q1 becomes more positive and the base of transistor Q2 becomes more negative. This unbalance will result in an unbalancing of the current flow through the collector terminal leads 12 and 13 and thus a difference in the voltage drops across the resistors R1 and R2. A difference voltage Vd will thus initially be developed which will drive the main amplifier stages 19 to result in an amplified output voltage signal.

The output voltage signal is impressed across the base terminals 21 and 22 of the input circuit for the feedback amplifier resulting in unbalanced currents in the collector terminal leads 23 and 24. This unbalanced current causes a difference voltage resulting from different voltage drops across R3 and R4 which is amplified by the multi-stage amplifier 25. The amplified differential signal appears on the output leads 28 and 29 and results in a large change in the base voltages for the first transistors Q5 and Q6. This relatively large change in base voltages causes an unbalance in the collector currents for Q5 and Q6 and thus the currents *i*1 and *i*2.

The second transistors Q7 and Q8 also experience this large voltage change on their bases which will result in an unbalance of their collector currents in collector leads 38 and 39. These collector currents constitute feedback currents for the beta amplifier itself and are impressed across the fixed resistor Rg'. The direction of the resulting difference current caused to flow through Rg' is such as to cancel the original difference current originally flowing through Rg' as a consequence of the beta input voltage applied to the transistors Q3 and Q4. The difference current fed back from Q7 and Q8 comes to equilibrium when the resulting voltage drop across Rg' is equal to the beta input voltage; that is, the output voltage signal from the main amplifier. The collector currents in Q7 and Q8 are substantially identical to the collector currents of Q5 and Q6 as a consequence of the inherent matching of the monolithic dual transistors. The result is an output difference current which is precisely proportional to the input voltage to the beta amplifier all as clearly shown in FIG. 2.

The now unbalanced currents i1 and i2 appear across the single gain setting resistor Rg in the input stage for the main amplifier. A difference current is thus caused to flow through the single resistor Rg as indicated at *i*3. A negative feedback voltage Es is thus developed across Rg which approaches the value of the differential input signal Ein. As a result, the base to emitter voltages of the transistors Q1 and Q2 will approach equality in a manner tending to restore the balance between the collector currents in the collector leads 12 and 13. As this balance is restored, the difference voltage Vd between the voltage drops developed across the resistors R1 and R2 will be reduced to a very small value.

This small value of difference voltage Vd enters the main operational amplifier 19 which has an extremely high gain to provide the output voltage signal fed to the beta amplifier. As the difference voltage Vd passing to the main operational amplifier is reduced, the output voltage signal to the beta amplifier is correspondingly reduced to vary the differential feedback current i3 to a value in which the feedback voltage Es across Rg substantially equals the differential input signal Ein. The loop thus comes to equilibrium essentially when the voltage developed across the single gain setting resistor Rg by the difference current i3 equals the incoming voltage Ein.

In the specific example described with respect to FIGS. 1 and 2, this equilibrium point is taken when the output voltage signal from the main amplifier is ten volts. With specific reference to FIG. 2, for this input voltage value to the beta amplifier as indicated by the vertical dashed line 42, the generated feedback currents i1 and i2 might have values corresponding respectively to one hundred and three hundred microamperes. The difference current i3 would then be 200 microamperes and this difference current would generate the negative feedback voltage Es which would be substantially equal to the Ein differential input signal.

As long as the differential input signal Ein remains constant, the output voltage signal Eout will be constant and will represent a fixed amplified value of the input signal. A change in the input signal will unbalance the input stage to provide the difference voltage Vd which in turn results in a change in the amplified output signal Eout. This changed output signal then results in a change in the differential feedback current in accord with the transconductance characteristics of FIG. 2 to restore the balance in the input stage. The new values of the output voltage Eout to maintain the new balanced conditions constitutes a fixed amplified value of the changed value of the input. An extremely linear amplifier results.

It is to be noted that by employing a fully differential feedback amplifier system with the transconductance characteristics as described, series feedback can be employed with the advantage of a relatively high input impedance. Further, it will be noted that the overall gain of the transducer amplifier system can readily be controlled by the single gain setting resistor Rg. The use of a single resistor provides an extremely flexible method of changing the gain and avoids the matching and trimming of resistors as would have been necessary heretofore.

Finally, the provision of bipolar transistor pairs at the input portions of both the main amplifier and the beta amplifier and the use of monolithic dual transistors for the transistor pairs Q5, Q7 and Q6, Q8 render the entire circuit ideally suited for manufacture by the use of integrated circuits.

From the foregoing description, it will thus be evident that the present invention has provided a greatly improved transducer amplifier system wherein the various objects set forth heretofore are fully realized.

What is claimed is:

1. An amplifier system comprising an input stage in the form of a difference amplifier for receiving a differential input signal, said difference amplifier comprising first and second transistors, the bases of which comprise a first pair of input terminals, the emitters of which comprise a second pair of input terminals, and the collectors of which comprise a first pair of output terminals, said first pair of input terminals receiving said differential input signal, a single gain-setting resistor being connected across said second pair of input terminals, each of said first pair of output terminals being connected to a voltage source by a corresponding one of a pair of equal-valued load resistors;

a main operational amplifier connected to said first pair of output terminals from said input stage, said main operational amplifier possessing a single-ended output terminal, the difference in current through said load resistors in response to an unbalance of current flow in said first pair of output terminals providing a difference voltage to said main operational amplifier, said differential input signal providing an initial unbalance of current flow in said first pair of output terminals to provide said initial difference voltage which, in turn, is amplified by said main operational amplifier to provide said output voltage signal; and an active feedback differential amplifier possessing a third pair of input terminals and a second pair of output terminals, one of said third pair of input terminals being connected to said single-ended output terminal of said main operational amplifier, the other of said third pair of input terminals being connected to a source of reference potential, and said second pair of output terminals being connected to said second pair of input terminals to said input stage, said feedback differential amplifier producing on each of said second pair of output terminals a current which passes through said single gain-setting resistor generating a feed-back voltage across said single gain-setting resistor to substantially restore the balance of current flow in said first pair of output terminals from said difference amplifier, said feedback differential amplifier producing a feedback voltage across said single gain-setting resistor linearly proportional to the output voltage from said main operational amplifier.

2. An amplifier system comprising an input stage in the form of a difference amplifier for receiving a differential input signal, said input stage containing a first pair and a second pair of input terminals and a first pair of output terminals;

a main operational amplifier connected to said first pair of output terminals from said input stage, said main operational amplifier possessing a single-ended output terminal; and an active differential amplifier possessing a third pair of input terminals and a second pair of output terminals, one of said third pair of input terminals being connected to said single-ended output terminal of said main operational amplifier, the other of said third pair of input terminals being connected to a source of reference potential, and said second pair of output terminals being connected to said second pair of input terminals to said input stage, said active feedback differential amplifier comprising a differential input circuit possessing said third pair of input terminals and, in addition, a fourth pair of input terminals; and a third pair of output terminals, said differential input circuit rejecting signals common to the terminals in said third pair of input terminals;

a multi-stage differential amplifier possessing a fifth pair of input terminals and a fourth pair of output terminals, said fifth pair of input terminals being connected to said third pair of output terminals from said differential input circuit; and first and second transistor pairs the first transistor in each pair having its base connected to a corresponding one of said fourth pair of output terminals thereby to generate on the collector terminals of the first transistors in each pair of first and a second current, any unbalance therebetween defining said differential feedback current, the collector of said first transistor in each pair being connected to a corresponding one of said fourth pair of input terminals and the emitter of said first transistor in each pair being connected to a selected potential through resistors, and the second transistor in each pair having its base also connected to a corresponding one of said fourth pair of output terminals to generate, respectively, feedback currents to said second pair of input terminals to said input stage substantially identical to said first and second currents, the collectors of said second transistors in each pair being connected to corresponding ones of said second pair of input terminals to thereby linearize and establish an accurate differential transconductance characteristic in said feedback amplifier and establish substantially ideal differential current generator outputs, and the emitters of said second transistor in each pair being connected to said selected potential through load resistors.

3. A system according to claim 2, in which each of said transistor pairs constitutes monolithic dual transistors thereby providing inherent matching of the first and second transistors in each pair.

4. An amplifier having a high common-mode rejection ratio comprising, in combination;

an input stage;

a main amplifier means containing differential input terminals; and an active feedback means;

said input stage comprising a single gain-setting resistor, and a difference amplifier made up of first and second transistors having input terminals for receiving a differential input signal, output terminals connected to the differential input terminals to said main amplifier means and including equal-valued load resistors, each connecting one of said output terminals to a source of potential, for providing a difference voltage to said main amplifier means in response to an unbalance of current flow in said output terminals, and common terminals connected by said single gain-setting resistor;

said feedback means having a set of input leads, a set of common leads and a set of output leads, said set of input leads connected to receive the output voltage signal from said main amplifier means resulting from said difference voltage, said feedback means comprising means for generating two sets of first and second feedback currents;

means for applying the first set of feedback currents to said single gain-setting resistor to generate a voltage across said resistor substantially equal to said differential input signal thereby restoring said balance of current flow in said output terminals from said input stage; and means for applying the second set of feedback currents to a second resistor connected across said set of common leads to generate a voltage across this second resistor substantially equal to the output voltage from said main amplifier means.

5. A system according to claim 4, in which said first and second transistors are defined by a bipolar transistor pair having base terminals constituting said input terminals, collector terminals constituting said output terminals, and emitter terminals constituting said common terminals.

6. A system according to claim 4, in which said first and second transistors comprise field effect transistors having gate terminals constituting said input terminals, drain terminals constituting said output terminals, and source terminals constituting said common terminals, thereby providing a relatively high input impedance for said input stage.

7. A system according to claim 4, in which said active feedback means includes a differential amplifier;

an input circuit made up of third and fourth transistors having input terminals receiving said output voltage signal from said main amplifier means, output terminals connected to the input of said differential amplifier, and common terminals connected across a fixed resistor; and first and second transistor pairs, first transistors in each pair having their base terminals connected to the differential output of said differential amplifier to generate on their collector terminals said first and second feedback currents to the common terminals from said input stage,, and second transistors in each pair having their base terminals connected to said differential output and their collector terminals connected across said fixed resistor to provide first and second currents to said fixed resistor substantially identical to said first mentioned first and second feedback currents, thereby providing a voltage across said fixed resistor substantially equal to the output voltage signal from said main amplifier applied to said input circuit, with the result that said transconductance characteristic of said feedback amplifier means is accurately established and linearized.

8. A system according to claim 7, in which each of said transistor pairs constitute monolithic dual transistors thereby providing inherent matching of the first and second transistors in each pair.

9. A system according to claim 7, in which said third and fourth transistors comprise a bipolar transistor pair having base terminals constituting said input terminals, collector terminals constituting said output terminals, and emitter terminals constituting said common terminals.

10. A system according to claim 7, in which said third and fourth transistors comprise field effect transistors having gate terminals constituting said input terminals, drain terminals constituting said output terminals, and source terminals constituting said common terminals, thereby providing a relatively high imput impedance for said input stage.

11. A system according to claim 7, including first and second resistance-capacitor means connected across the differential input terminals to said main amplifier means and said differential amplifier in said active feedback means, respectively, to provide phase-gain compensation and thereby to provide loop stability for said system over its operating frequency range.

* * * * *